US009313906B2

(12) United States Patent  
Prest et al.

(10) Patent No.: US 9,313,906 B2  
(45) Date of Patent: *Apr. 12, 2016

(54) UNITARY HOUSING FOR ELECTRONIC DEVICE

(71) Applicant: Apple Inc., Cupertino, CA (US)

(72) Inventors: Christopher D. Prest, San Francisco, CA (US); Stephen P. Zadesky, Portola Valley, CA (US); Trent Weber, San Francisco, CA (US); Lucy E. Browning, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/755,994

(22) Filed: Jun. 30, 2015

(65) Prior Publication Data

US 2015/0305175 A1    Oct. 22, 2015

Related U.S. Application Data

(63) Continuation of application No. 14/252,516, filed on Apr. 14, 2014, now Pat. No. 9,095,044, which is a continuation of application No. 12/978,117, filed on Dec. 23, 2010, now Pat. No. 8,730,656.

(60) Provisional application No. 61/413,245, filed on Nov. 12, 2010.

(51) Int. Cl.
| | |
|---|---|
| *G06F 1/16* | (2006.01) |
| *H05K 5/02* | (2006.01) |
| *G06F 1/18* | (2006.01) |
| *H01L 23/043* | (2006.01) |
| *H01L 23/047* | (2006.01) |
| *H01L 23/053* | (2006.01) |
| *H01L 23/057* | (2006.01) |
| *H01L 23/10* | (2006.01) |
| *H05K 5/00* | (2006.01) |
| *H05K 13/00* | (2006.01) |
| *H05K 5/04* | (2006.01) |
| *H05K 5/06* | (2006.01) |

(52) U.S. Cl.
CPC .............. *H05K 5/02* (2013.01); *G06F 1/1656* (2013.01); *G06F 1/181* (2013.01); *H01L 23/043* (2013.01); *H01L 23/047* (2013.01); *H01L 23/053* (2013.01); *H01L 23/057* (2013.01); *H01L 23/10* (2013.01); *H05K 5/0004* (2013.01); *H05K 5/0021* (2013.01); *H05K 5/04* (2013.01); *H05K 5/069* (2013.01); *H05K 13/00* (2013.01); *H01L 2924/0002* (2013.01); *Y10T 29/302* (2015.01); *Y10T 29/49002* (2015.01); *Y10T 29/49826* (2015.01)

(58) Field of Classification Search
CPC ...................................................... G06F 1/1616
USPC .................................................... 361/679.01
See application file for complete search history.

(56) References Cited

U.S. PATENT DOCUMENTS 6,974,635 B1 * 12/2005 Funamoto et al. ............ 428/609  
8,492,661 B2 *  7/2013 Jol ................................ 174/520

(Continued)

*Primary Examiner* — Forrest M Phillips  
(74) *Attorney, Agent, or Firm* — Downey Brand LLP

(57) ABSTRACT

An electronic device having a unitary housing is disclosed. The device can include a first housing component having an open cavity, an internal electronic part disposed within the cavity, a second housing component disposed across the cavity, and a support feature disposed within the cavity and arranged to support the second housing component. The first housing component can be formed from metal, while the second housing component can be formed from a plurality of laminated foil metal layers. The second housing component can be attached to the first housing component via one or more ultrasonic welds, such that a fully enclosed housing is created. The fully enclosed housing can be hermetically sealed, and the outside surfaces thereof can be machined or otherwise finished after the ultrasonic welding.

20 Claims, 7 Drawing Sheets

(56) References Cited

U.S. PATENT DOCUMENTS

| | | |
|---|---|---|
| 9,095,044 B2 * | 7/2015 | Prest et al. |
| 2006/0175691 A1 * | 8/2006 | Dangelmaier et al. ........ 257/677 |
| 2010/0061040 A1 * | 3/2010 | Dabov et al. ............. 361/679.01 |
| 2010/0271760 A1 * | 10/2010 | Wei et al. ................. 361/679.01 |
| 2012/0212890 A1 * | 8/2012 | Hoshino et al. .......... 361/679.01 |
| 2014/0063745 A1 * | 3/2014 | Warren et al. ................. 361/720 |
| 2014/0247554 A1 * | 9/2014 | Sharma et al. ................ 361/695 |

\* cited by examiner

UNITARY HOUSING FOR ELECTRONIC DEVICE

CROSS REFERENCE TO RELATED APPLICATIONS

This application is a continuation of U.S. application Ser. No. 14/252,516, filed Apr. 14, 2014, entitled "UNITARY HOUSING FOR ELECTRONIC DEVICE", which is a continuation of U.S. application Ser. No. 12/978,117, filed Dec. 23, 2010, entitled "UNITARY HOUSING FOR ELECTRONIC DEVICE", which claims priority to U.S. Provisional Patent Application No. 61/413,245, filed Nov. 12, 2010, entitled "UNITARY HOUSING FOR ELECTRONIC DEVICE", each of which are incorporated by reference in their entirety for all purposes.

FIELD

The present invention relates generally to electronic devices, and more particularly to the formation of enclosed housings for electronic devices.

BACKGROUND

Personal computing and electronic devices, such as laptop computers, media players, cellular telephones and the like are becoming increasingly more sophisticated, powerful and consumer friendly. The ability to fabricate various components of these devices in smaller sizes, while still maintaining or increasing the power, operating speed and aesthetic appeal of such devices, has contributed greatly to this trend. Unfortunately, the trend of smaller, lighter and more powerful portable computing devices presents continuing design challenges in the actual formation of some components for these devices. One design challenge associated with such electronic devices and components therefor is the formation of the outer enclosure or housing used to house the various internal device components therein.

In particular, many electronic devices have housings that are made from several different parts, as well as complex mechanical structures, features, and/or other internal parts that must also connect or attach to the housing. Even in the more eloquently designed electronic devices, outer housings are still typically formed from multiple parts, which tends to result in at least seams or other discontinuities, if not exposed screws, tabs or other component fasteners. For example, outer housings made from just two main parts typically include an upper casing and a lower casing that are placed on top of one another and fastened together using screws or other fastening means. Such techniques typically complicate the housing design and create aesthetic difficulties because of undesirable cracks, seams, gaps or breaks at the mating surfaces, as well as exposed fasteners located along the surfaces of the housing. Even where fasteners are hidden or removed altogether from the outer surfaces of an electronic device, a mating line or seam surrounding the entire enclosure is still often produced when using an upper and lower casing.

Although such seams or gaps generally tend to detract from the overall aesthetic appeal of the device, it is typically necessary to form device housings from multiple parts for the simple reason that access to the internal regions of an electronic device or component is needed at least during the manufacture of the device or component. In instances where access to the internal regions of the device or component is really not needed once the device is manufactured, however, the existence of a mating line, gap, seam, or any other artifacts of manufacture are usually an unnecessary and unseemly byproduct of the manufacturing process.

While many designs and techniques used to provide outer housings for electronic devices and components have generally worked well in the past, there is always a desire to provide alternative housing designs and techniques for new and aesthetically pleasing devices.

SUMMARY

It is an advantage of the present invention to provide a single unitary housing for an electronic device that has no apparent seams or other artifacts of manufacture on its outer surface. This can be accomplished at least in part through the use of housing components that have been ultrasonically welded together with the pertinent internal parts already disposed inside the housing to form a single unitary housing that can be machined and refinished at its outer surfaces as a single item.

In various embodiments, an electronic device can include a first housing component having an open cavity, one or more internal electronic parts disposed within the cavity, a second housing component disposed across the cavity, and a support feature disposed within the cavity and arranged to support the second housing component. The first housing component can be at least partially formed from metal, at least at a surface region to be attached to the second housing component, while the second housing component can be formed from a plurality of laminated foil metal layers. The second housing component can be attached to the first housing component via one or more ultrasonic welds, such that a fully enclosed housing is created. The support feature can be arranged to support at least some of the laminated foil metal layers during the ultrasonic welding process. The fully enclosed housing can be hermetically sealed, and the outside surfaces thereof can be machined or otherwise finished after the ultrasonic welding.

In various additional embodiments, a method of manufacturing an electronic device is provided. Such a method can be used in the manufacture of an entire electronic device or only a component of an electronic device, among other possible applications. Various process steps can include selecting a first housing component having an open cavity therein, installing an internal electronic device part within the open cavity, forming a second housing component from a plurality of metal foil layers, positioning a support feature within the open cavity, and attaching the second housing component to the first housing component and across the open cavity such that the cavity is fully enclosed and sealed. The first housing component can have a metal portion that includes a first metallic surface region disposed proximate the cavity. Also, the forming step can include ultrasonically welding the metal foil layers together, and the support feature provides support to the second housing component during the attaching step.

In various detailed embodiments, which can include the electronic device or its method of manufacture, attachment of the first housing component to the second housing component can include ultrasonically welding the second housing component to the first housing component. In addition, the internal electronic device part can include the support feature thereon, and can also be ultrasonically welded to the second housing component as a byproduct of the attaching process.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed unitary housings for electronic devices. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to a personal electronic device or component, such as a cellular telephone, media player, PDA, handheld electronic game, remote control, laptop computer, or other similar device. Such an electronic device or component can have a unitary outer housing, such that no perceptible seam or gap can be seen at any outer surface of the device. The result is an electronic device that is formed from a single unitary housing, which provides enhanced aesthetic appeal for many users. Such a device can be formed by way of fastening two or more outer housing components together in a special manner, such as by ultrasonically welding the components together.

In various embodiments of the present invention, a first metallic or partially metallic outer housing component having a metallic surface region is provided. The metallic surface region can be treated specifically to facilitate the ultrasonic bonding of another part of component thereto. In some embodiments, various undercuts or other surface irregularities can be formed on the metallic surface region in a manner to facilitate the welding or bonding to the other component when ultrasonic energy is appropriately applied. In other embodiments, such an ultrasonic bond or weld can fuse the first and second housing component even where no special surface treatment on the metal surface exists.

Figure 1A:
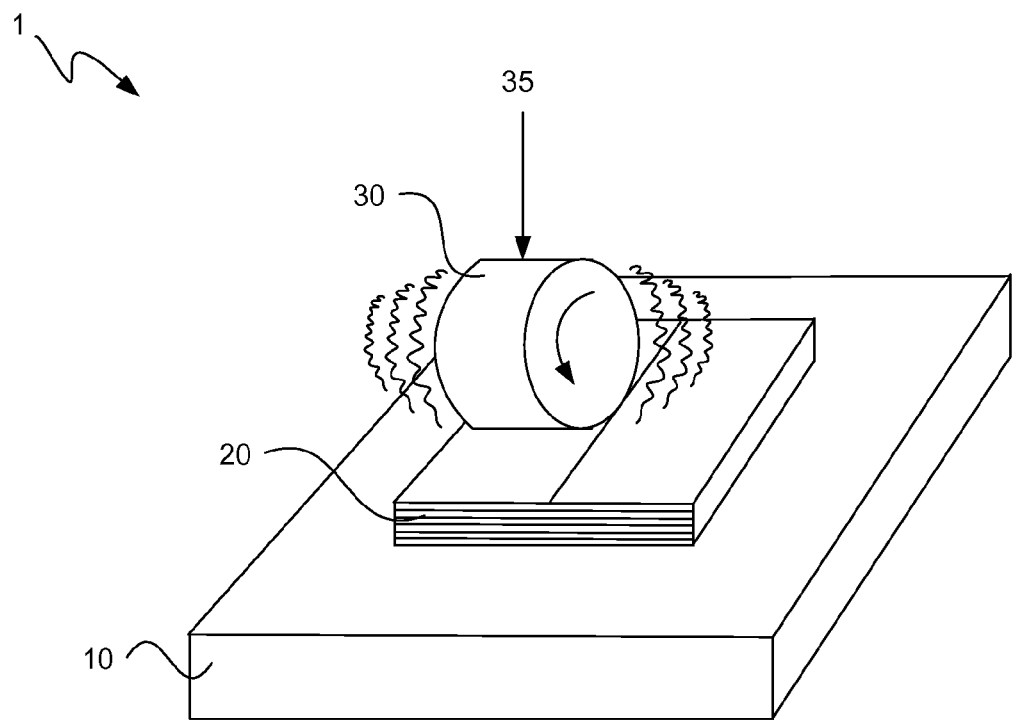
FIG. 1A illustrates in front perspective view an exemplary metal foil stack being ultrasonically welded together.

Starting with FIG. 1A, an exemplary metal foil stack being ultrasonically welded together is shown in front perspective view. Ultrasonic bonding system 1 can include a base plate 10, a plurality of thin material layers arranged in a stack 20 and an ultrasonically oscillating roller 30 that is rolled across a top layer of the stack while a downward force 35 is applied to the roller. In some embodiments, the thin layers of stack 20 can be formed from a metal foil, such that the ultrasonic bonding is in effect a low temperature metal "welding" process. In other embodiments, the thin layers can be of other types of material, such as specially adapted paper or a thermoplastic material suitable for ultrasonic bonding. Still further embodiments can involve a stack 20 having layers of different types of materials, as may be desired for a particular finished component.

In some embodiments, the various layers of stack 20 can be added one by one atop each other, with the ultrasonic roller 30 facilitating the bonding of each new layer onto the already formed stack beneath it. In addition, although a simple base plate 10 is shown for purposes of support to thin layer stack 20, such a base plate can include several components to facilitate such an ultrasonic bonding process. For example, the base plate can include a rigid plate that is placed atop a heating plate or anvil that is adapted to provide any required heat into the base plate and layer stack for the bonding process. Various additional items, features and processes associated with different forms of thin layer laminated object manufacturing ("LOM") may also be applied as may be desired.

Figure 1B:
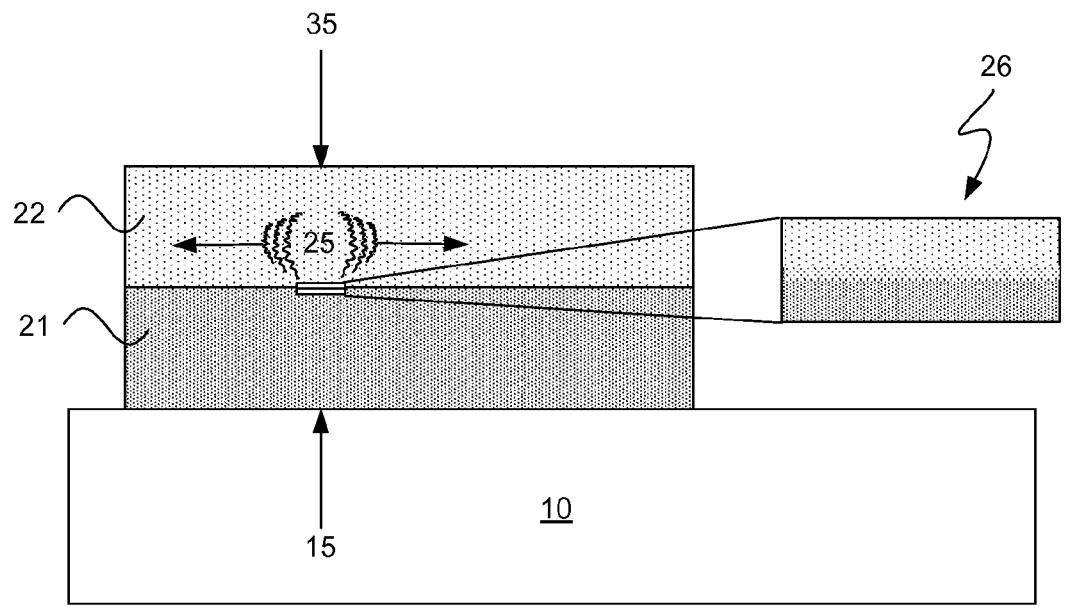
FIG. 1B illustrates in side elevation view the exemplary metal foil stack of FIG. 1A after the welding process.

Continuing with FIG. 1B, the exemplary stack of FIG. 1A after the welding process is illustrated in side elevation view. As shown, base plate 10 supports the thin layer stack and exerts an upward force 15 on stack layers 21 and 22 to counteract the downward force 35 of the ultrasonic roller. Ultrasonic mechanical vibrations 25 are transmitted through the material of layers 21 and 22 as a result of the ultrasonic oscillations of the roller. The combination of upward force 15, downward force 35 and these ultrasonic vibrations or forces 25 serve to bond the materials of the thin layers together, as shown in enlarged region 26. In general, suitably applied ultrasonic vibrations can meld the materials of the different layers together by way plastic deformation and/or atomic diffusion. As will be readily appreciated, the magnitude and frequency of the ultrasonic vibrations can be varied as may be appropriate for the thin layer thicknesses, bond strength desired and types of materials being bonded. For example, frequencies in the range of 10 to 100 kHz are suitable for many materials and thicknesses.

Figure 2A:
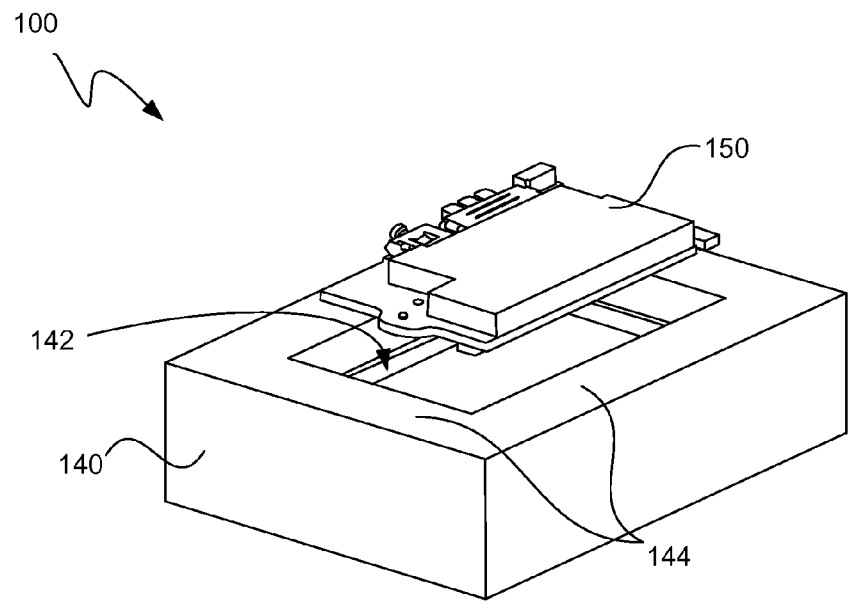
FIG. 2A illustrates in front perspective and partially exploded view an exemplary electronic device prior to full enclosure according to one embodiment of the present invention.

Turning next to FIG. 2A, an exemplary electronic device prior to full enclosure is shown in front perspective and partially exploded view. Electronic device 100 can include a first housing component 140 having an open cavity 142 formed therein, as well as a surface region 144 disposed about the cavity. This first or base housing component 140 can be formed from metal, for example, and the noted surface region 144 can be particularly suited for attachment to another outer housing component. Base housing component 140 can be, for example, machined, forged, cast, drawn or formed in any of numerous suitable ways. One or more internal electronic device parts 150 can be installed into the cavity 142 while the cavity remains open and accessible. Electronic device part 150 can be, for example, a completed circuit board with one or more processors, memories and the like situated thereon. Installation of electronic device part 150 can be by way of, for example, screws, snaps, rivets, glue, press fitting, or any other suitable installing means.

Figure 2B:
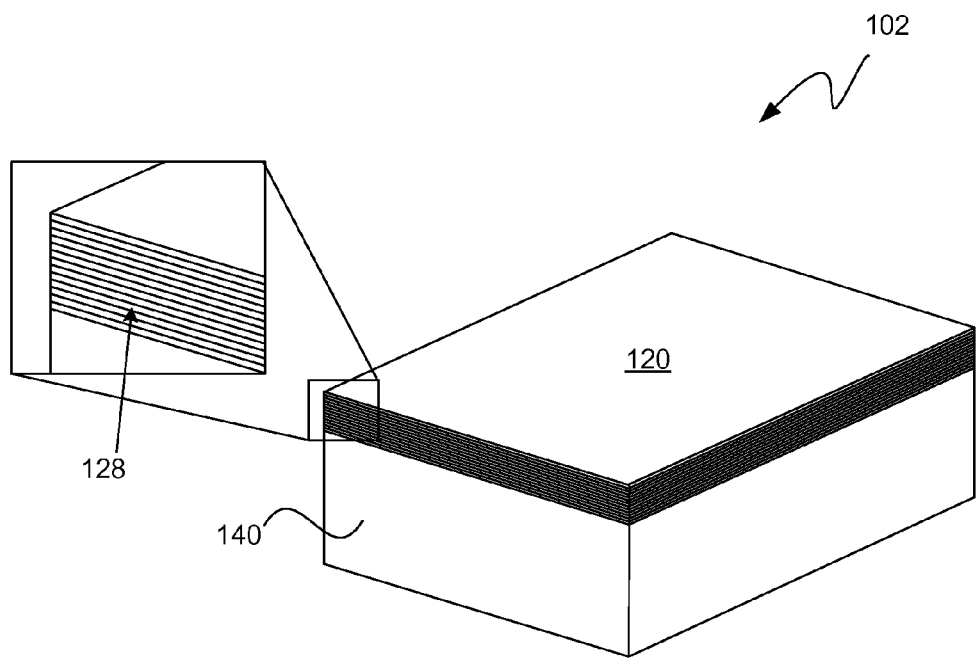
FIG. 2B illustrates in front perspective view the exemplary electronic device of FIG. 2A after assembly and full enclosure according to one embodiment of the present invention.

FIG. 2B illustrates in front perspective view the exemplary electronic device of FIG. 2A after assembly and full enclosure. Electronic device 102 can be fully enclosed by attaching a second housing component 120 atop the first housing component 140 such that the cavity 142 and part 150 are fully encapsulated within these housing components. The second or lid housing component 120 can be substantially similar to the layer stack 20 set forth above, and in fact the close-up portion of the figure shows that this component includes a number of bonded together layers 128. The result of the ultrasonic bonding of first and second outer housing components is that a single unitary housing is formed, within which the internal cavity and parts can be hermetically sealed if no other openings exist.

In one embodiment, this second housing component 120 is formed separately into a bonded stacked unit before attachment to the first housing component 140, while in other embodiments the second housing component is formed layer by layer on top of the first housing component and device part combination. That is, second housing component 120 can be built one layer at a time on top of the upper surface 144 of the first housing component 140 and one or more support features disposed in the cavity 142. In some embodiments, a support feature can be on the electronic device part 150 itself, such as an upper surface thereof. Such a support feature is particularly useful to provide an effective "base plate" in the cavity region of the base housing component as the early layers of the lid housing component are formed thereon.

As a particular example, the electronic device 100 of FIG. 2A can be assembled with the electronic part 150 suitably disposed within cavity 142. A single thin layer 128 can then be ultrasonically bonded or welded atop surface 144 and the upper surface of part 150 (or alternatively any other suitable support feature). After the first thin layer is bonded, then a second thin layer can be stacked atop the first layer and again ultrasonically bonded thereto. Additional layers can be similarly formed atop these layers until a final desired thickness for housing component 120 is achieved. Such ultrasonic bonds can be roll formed similar to that which is shown in ultrasonic bonding system 1 set forth above, for example.

Figure 3A:
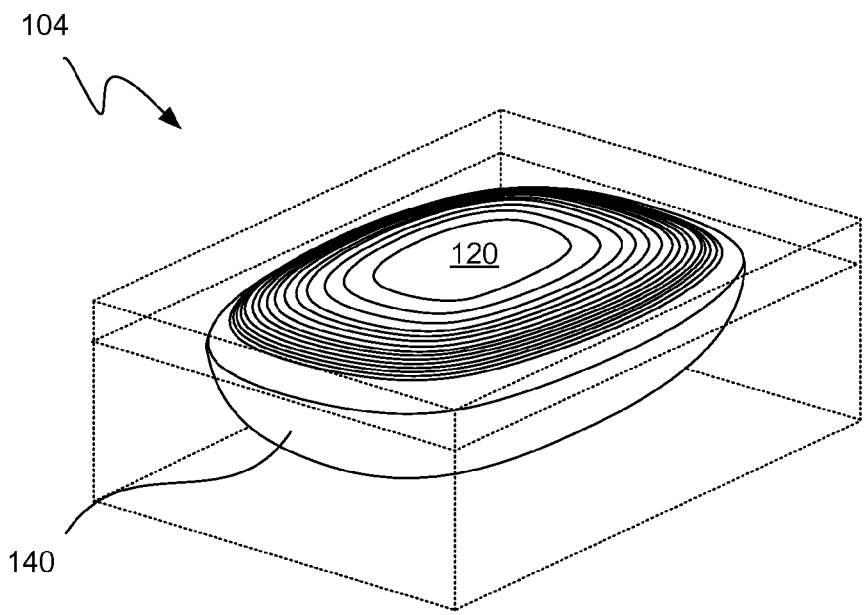
FIG. 3A illustrates in front perspective view the exemplary electronic device of FIG. 2B after machining and finishing of its outer surfaces according to one embodiment of the present invention.

Continuing with FIG. 3A, the exemplary electronic device of FIG. 2B is shown in front perspective view after machining and finishing of its outer surfaces according to one embodiment of the present invention. As will be understood, the resulting product shown in FIG. 2B need not be the final product. As such, various refining processes can be performed to the outer housing to result in a finished electronic device product 104. For example, both the lid component 120 and base component 140 can be machined and finished in various regions as shown such that a final rounded product having a unitary outer housing with no apparent seams, gaps or defects is produced. In some embodiments, such machining and finishing processes can be performed after block 102 is bonded together, while in other embodiments some machining and finishing can be done during the bonding process.

Figure 3B:
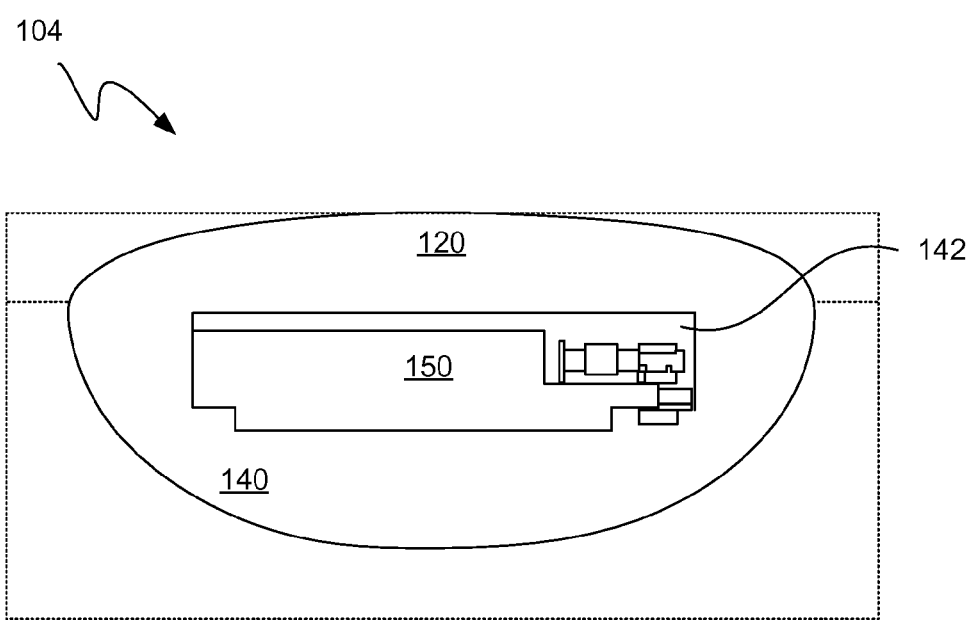
FIG. 3B illustrates in side cross-sectional view the exemplary electronic device of FIG. 3A according to one embodiment of the present invention.

FIG. 3B depicts in side cross-sectional view the exemplary electronic device of FIG. 3A. As will be readily appreciated, internal electronic device part or parts 150 still remain within cavity 142, which is now enclosed by first housing component 140 and second housing component 120. Again, these housing components 120, 140 have been machined and finished into a final form 104, such that the original block shape of the device 102 has been refined.

Figure 4A:
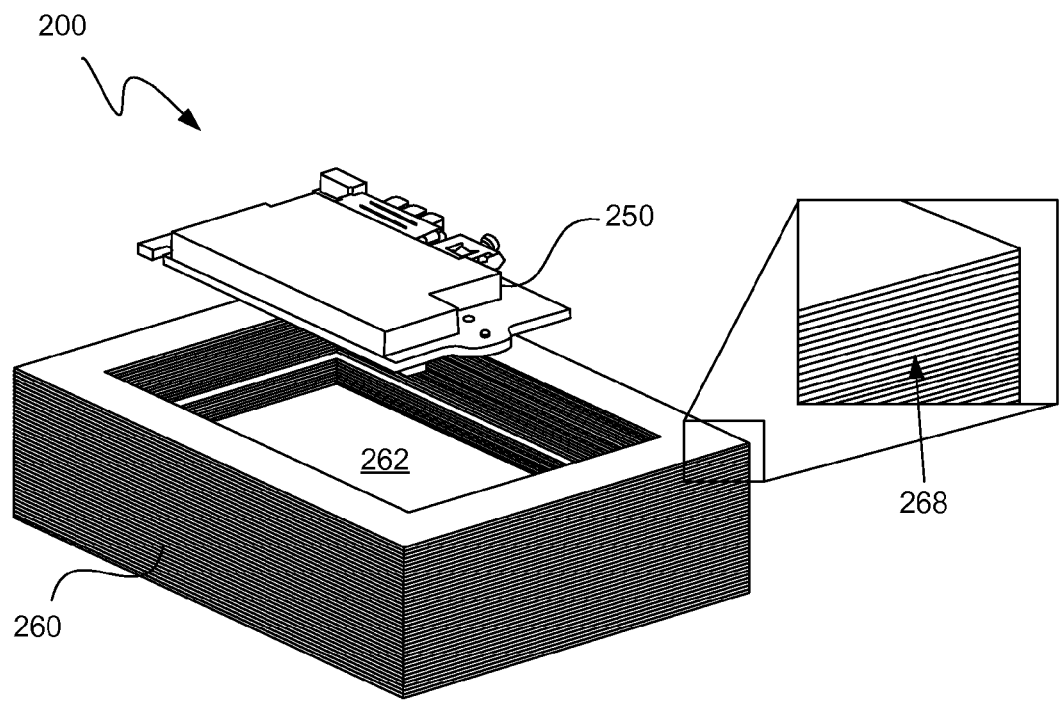
FIG. 4A illustrates in front perspective and partially exploded view an exemplary alternative electronic device prior to full enclosure according to one embodiment of the present invention.

Moving to FIG. 4A, an exemplary alternative electronic device prior to full enclosure according to another embodiment of the present invention is illustrated in front perspective and partially exploded view. Electronic device 200 can be substantially similar to device 100 above, in that it can include a first housing component 260 having an open cavity 262 formed therein, as well as a surface region disposed about the cavity and adapted for bonding to a second housing component. Again, this first or base housing component 260 can be formed from metal, for example. Similarly, one or more internal electronic device components 250, such as a circuit board, can be installed into cavity 262.

First or base housing component 260 is different than the foregoing embodiments, however, in that this base component can also be formed from a thin layer stack ultrasonic bonding process. As shown in the enlarged figure portion, first housing component 260 can be comprised of multiple thin layers 268 that are bonded atop each other in a manner similar to that set forth above. As such, cavity 262 can be formed by after machining and finishing processes to a final block of stacked and bonded material. Alternatively, each of the thin layers or foils can be specially formed or shaped as the process is ongoing. For example, the first several layers at the bottom of housing component 260 can be full sheets, while the middle and upper layers each have a suitable sized and shaped center hole.

Figure 4B:
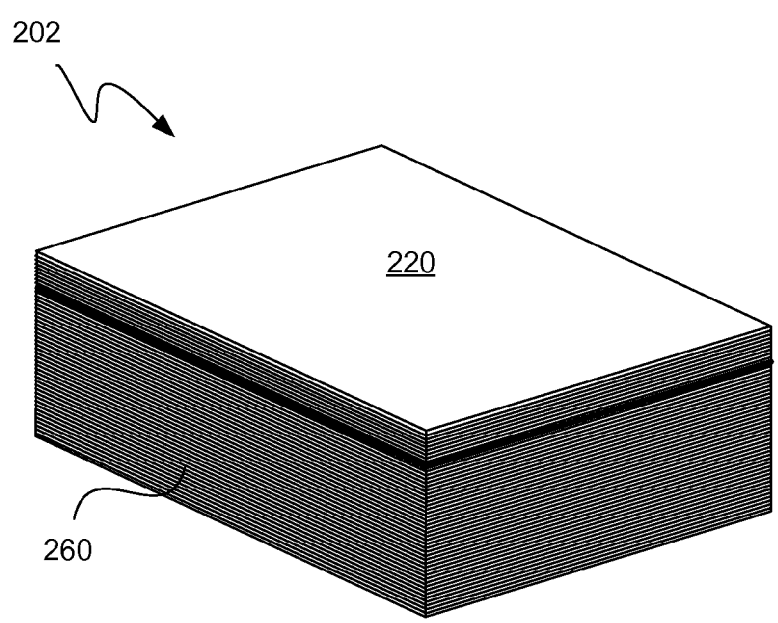
FIG. 4B illustrates in front perspective view the exemplary electronic device of FIG. 4A after assembly and full enclosure according to one embodiment of the present invention.

FIG. 4B shows the exemplary electronic device of FIG. 4A after assembly and full enclosure. Electronic device 202 can be formed by bonding second or lid housing component 220 to the first or base housing component 260. This can be done substantially similarly to electronic device 102 above, with the notable difference being that first housing component 260 is formed from a layered and bonded stack itself. Although not shown, it will be readily appreciated that the various after block machining and finishing processes can be performed to result in a final product that is substantially similar to device 104 disclosed above.

Figure 5:
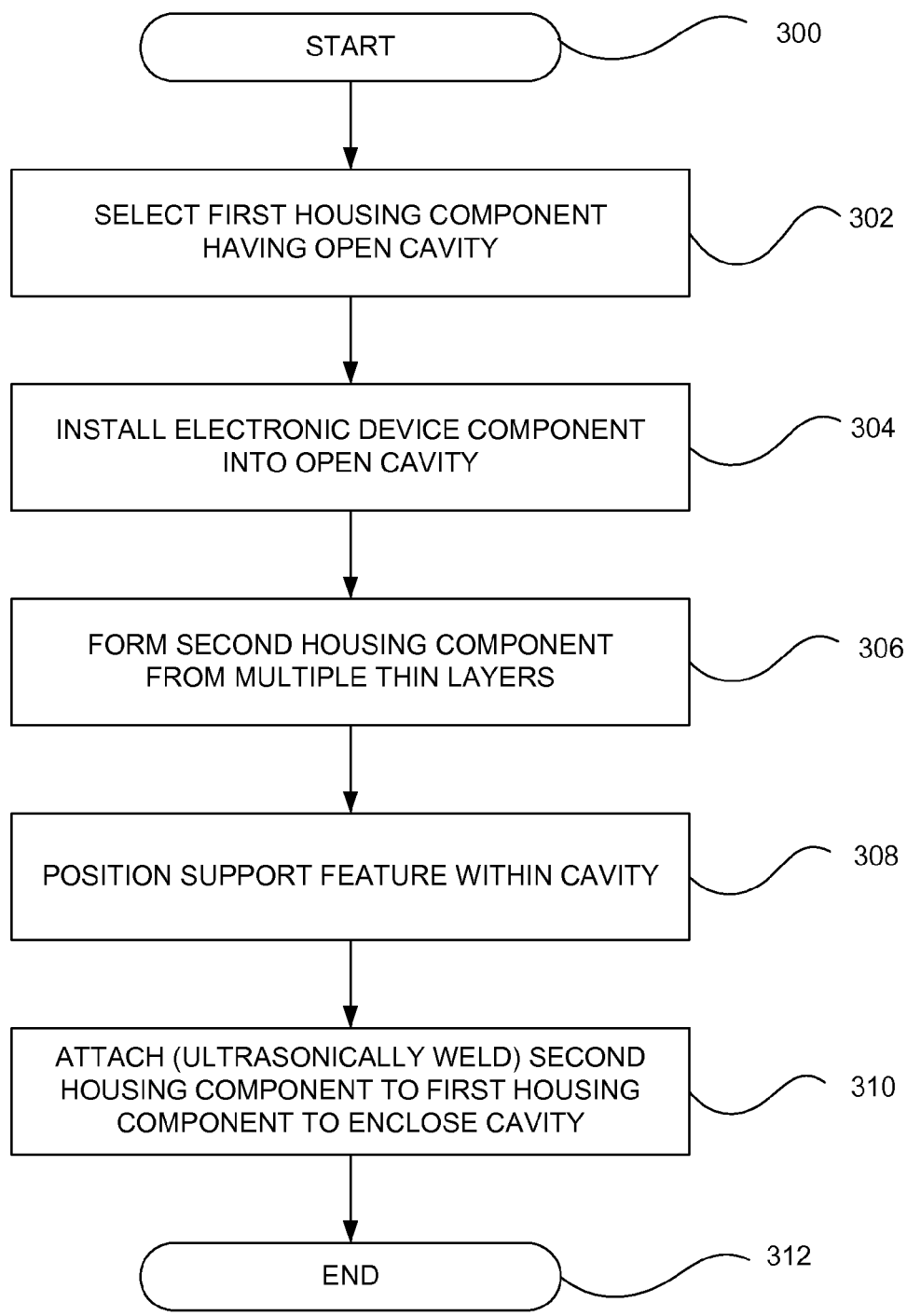
FIG. 5 provides a flowchart of an exemplary method of manufacturing an electronic device according to one embodiment of the present invention.

Turning next to FIG. 5, a flowchart of one exemplary method of manufacturing an electronic device is provided. It will be understood that the provided steps are shown only for purposes of illustration, and that many other steps may be included in the process, as may be desired. Furthermore, the order of steps may be changed where appropriate and not all steps need be performed in various instances. After a start step 300, a first housing component having an open cavity disposed therein is selected at process step 302. An internal electronic device component can be installed into the open cavity at process step 304, upon which a second housing component is formed from multiple thin layers, such as metal foil layers at process step 306. A support feature can then be positioned within the cavity at process step 308. At process step 310, the second housing component can be ultrasonically bonded or otherwise attached to the first housing component such that the cavity is enclosed and sealed off, after which he process ends at end stop 312.

Figure 6A:
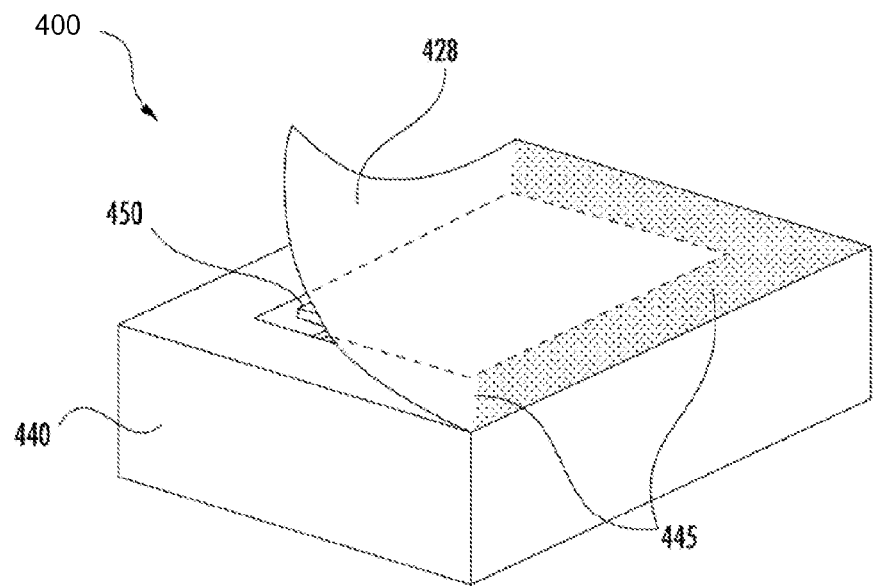
FIG. 6A illustrates in front perspective view an exemplary electronic device prior having a first single laminated foil layer being bonded thereto according to one embodiment of the present invention.

Continuing with FIG. 6A, an exemplary electronic device prior having a first single laminated foil layer being bonded thereto is illustrated in front perspective view. Electronic device 400 can be identical or substantially similar to electronic device 100 above, and this example is being provided solely to emphasize the ability to form the second or upper housing component layer by layer atop the lower or first housing component 440. Similar to the foregoing embodiment, a first housing component 440 can have an open cavity formed therein, with one or more internal electronic device parts 450 installed into the cavity while the cavity remains open and accessible. Again, electronic device part 450 can be, for example, a completed circuit board with one or more processors, memories and the like situated thereon, and the installation of the electronic device part can be by way of, for example, screws, snaps, rivets, glue, press fitting, or any other suitable installing means.

A single laminated metal foil layer 428 can then be ultrasonically bonded atop the first housing component 440 at one or more upper surface regions or locations 445. Although single layer 428 is shown as being partially open to reveal a portion of the cavity and electronic device part 450 therein, it will be readily appreciated that such a position is not necessary as part of the formation or bonding process, and that the entire single layer is preferably bonded to the first housing component around the full circumference of the cavity when bonding is complete. Once the ultrasonic bonding or welding of first single layer 428 to the first or main housing component is complete, then a second single layer is fully ultrasonically bonded atop the first single layer. Then a third layer is bonded atop the second layer, and so forth, until the total desired number of layers have been bonded atop each other one by one. In this manner, the second housing component is formed in place atop the first housing component.

Figure 6B:
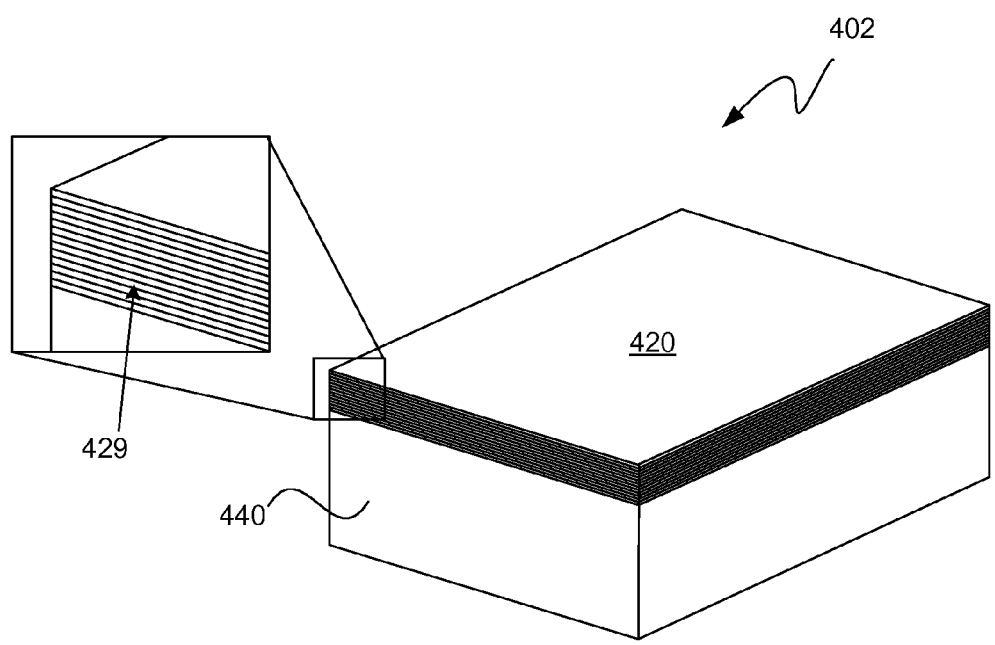
FIG. 6B illustrates in front perspective view the exemplary electronic device of FIG. 6A after bonding of all laminated foil layers thereto and full enclosure according to one embodiment of the present invention.

FIG. 6B illustrates in front perspective view the exemplary electronic device of FIG. 6A after bonding of all laminated foil layers thereto and full enclosure according to one embodiment of the present invention. Fully enclosed electronic device 402 can be identical or substantially similar to device 102 above, and is provided here for purposes of illustration to show the fully enclosed device of a layer by layer bonding process, resulting in a number of layers 429 bonded together to form the second housing component 420, which is bonded to the top surface(s) of the first housing component 420 by way of the first layer 428 being initially bonded to the first housing component. Again, one or more internal features, such as item(s) on the electronic device part can be used to provide support for bonding across the open cavity region while the first layer 428 is bonded, and the enclosed device 402 can be machined after the bonding process to result in a finally produced shape.

Figure 7:
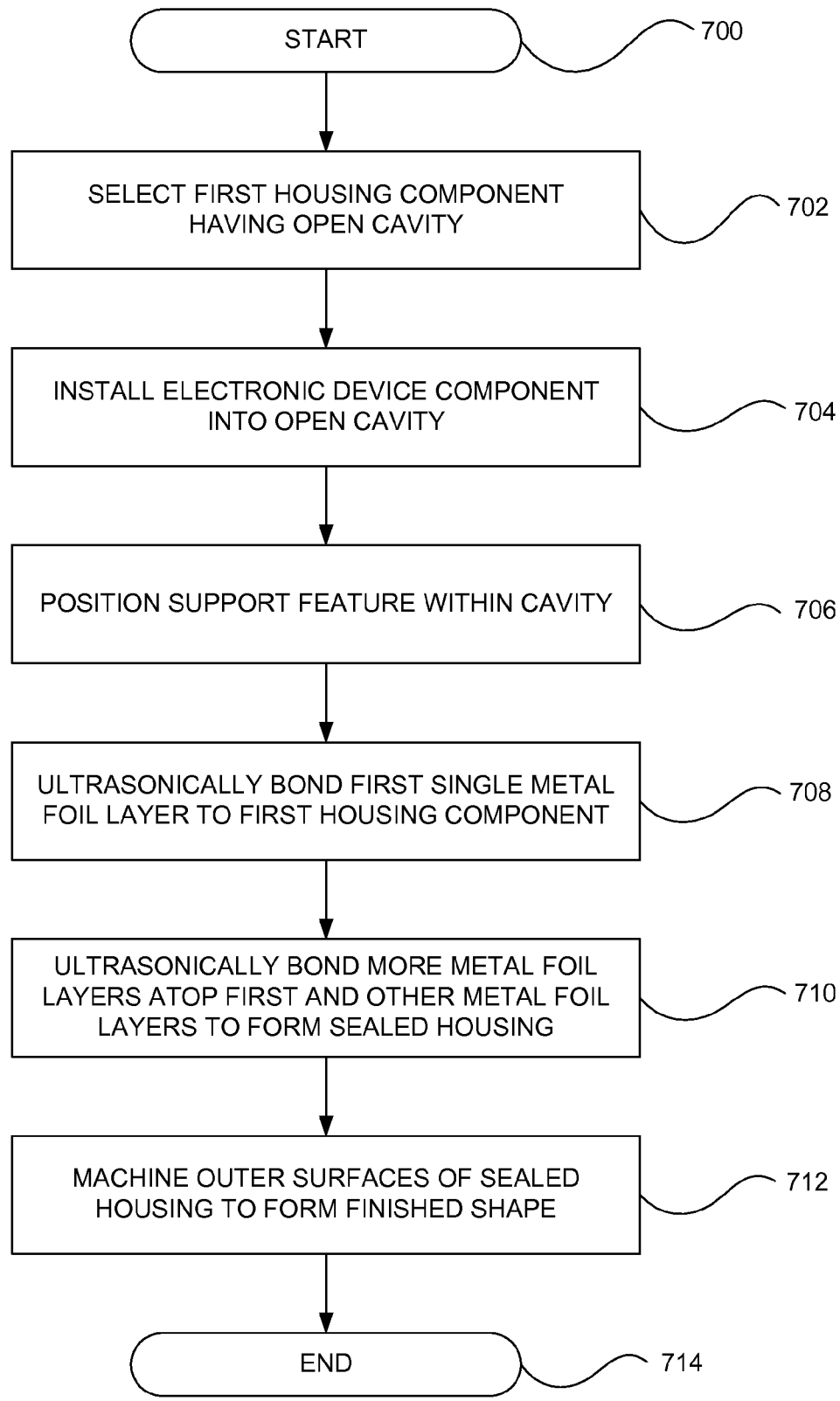
FIG. 7 provides a flowchart of an alternative exemplary method of manufacturing an electronic device according to one embodiment of the present invention.

Turning lastly to FIG. 7, a flowchart of an alternative exemplary method of manufacturing an electronic device according to one embodiment of the present invention is provided. Again, it will be understood that the provided steps are shown only for purposes of illustration, and that many other steps may be included in the process, as may be desired. Furthermore, the order of steps may be changed where appropriate and not all steps need be performed in various instances. After a start step 700, a first housing component having an open cavity disposed therein is selected at process step 702. As noted above, this first housing component can be formed by way of ultrasonically bonding single thin layers together and then aftermachining the finished block, or it can be formed by any other typical formation process, such as casting, extruding, machining and the like.

Again, an internal electronic device component can be installed into the open cavity at process step 704, upon which a support feature is then positioned within the cavity at process step 706. The support feature can be an upper surface of the electronic device component or some portion thereof. At subsequent process step 708, a first single laminated metal foil layer can be ultrasonically bonded or otherwise attached to upper surface(s) of the first housing component and the support feature such that the cavity is enclosed and sealed off, after which more laminated metal foil layers are ultrasonically bonded or otherwise attached atop each other one by one at process step 710 until the desired number of layers has been achieved. The outer housing can then be machined to a final shape at process step 712, after which the process ends at end stop 714.

Again, it will be understood that the order of steps here can be altered, and that some steps can be performed simultaneously. For example, the first housing component can be machined into its final form prior to any ultrasonic bonding of the thin metal foil layers thereto. Furthermore, it will be appreciated that this particular way of forming an outer housing by way of ultrasonic bonding and further machining or finishing of the end product results in a housing that appears to be free of any seams, joints, screws or other unsightly byproducts of a multi-piece housing. The aesthetical appeal of such a finished product is an improvement of other housings having a plurality of components and such seams or attaching features.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A housing for carrying an operational component, comprising:
   a layered stack, each layer formed of a bondable material and bonded together in a manner that defines at least in part an internal volume; and
   an opening suitable for receiving the operational component for placement within or removal from the internal volume.

2. The housing as recited in claim 1, wherein at least some of the layers comprise an approximately uniform thickness.

3. The housing as recited in claim 1, further comprising a solid base portion useable as a support for the housing.

4. The housing as recited in claim 3, wherein the layered stack is bonded to the solid base portion.

5. The housing as recited in claim 1, further comprising a component support structure disposed within the internal volume and coupled with at least a portion of an interior facing surface of the housing.

6. The housing as recited in claim 4, wherein at least a portion of the component support structure is formed of the bondable material that is bonded into the layered stack.

7. The housing as recited in claim 1, wherein at least two adjacent layers are formed of an ultrasonically bondable material.

8. The housing as recited in claim 6, wherein the ultrasonically bondable material is metal or specially adapted paper or a thermoplastic material.

9. A portable computing device, comprising:
- a housing having an opening to an interior cavity, the housing comprising a metal layer joined to other metal layers by metal to metal bonds, the joined metal layers having a seamless outer surface; and
- an operational component disposed at least partially within the interior cavity.

10. The portable computing device as recited in claim 9, wherein the operational component is disposed at least partially within the opening.

11. The portable computing device as recited in claim 9, wherein the opening is suitable for receiving the operational component for placement within or removal from the interior cavity.

12. The portable computing device as recited in claim 10, the housing further comprising a base portion.

13. The portable computing device as recited in claim 12, wherein the base portion is formed from a material other than the metal that forms the metal layer or the other metal layers.

14. The portable computing device as recited in claim 9, wherein most of the other metal layers are characterized as having about the same thickness.

15. A housing for carrying an operational component, comprising:
- a housing component comprising a structural laminate formed of sheets of a bondable material that when bonded together cooperate to help define an internal cavity and an opening suitable for receiving the operational component for placement within the internal cavity.

16. The housing as recited in claim 15, further comprising a surface region disposed about the internal cavity and adapted for bonding to the housing component to another housing component.

17. The housing as recited in claim 15, the structural laminate comprising a distal portion comprising full sheets of the bondable material that are bonded together, and a proximal portion comprising partial sheets of the bondable material that are bonded together.

18. The housing as recited in claim 17, wherein the partial sheets comprise a suitable sized and shaped hole.

19. The housing as recited in claim 15, wherein at least two adjacent sheets are formed of ultrasonically bondable material and comprise about the same thickness.

20. The housing as recited in claim 19, wherein the ultrasonically bondable material is a metal.

* * * * *